(12) United States Patent
Shimanek et al.

(10) Patent No.: US 8,350,590 B1
(45) Date of Patent: Jan. 8, 2013

(54) METHOD AND APPARATUS FOR DISTRIBUTING CLOCK SIGNALS

(75) Inventors: Schuyler E. Shimanek, Albuquerque, NM (US); Wayne E. Wennekamp, Rio Rancho, NM (US); Charles D. Laverty, Albuquerque, NM (US); Roger D. Flateau, Jr., Albuquerque, NM (US); John O'Dwyer, Maynooth (IE)

(73) Assignee: Xilinx, Inc., San Jose, CA (US)

( * ) Notice: Subject to any disclaimer, the term of this patent is extended or adjusted under 35 U.S.C. 154(b) by 249 days.

(21) Appl. No.: 12/694,973

(22) Filed: Jan. 27, 2010

Related U.S. Application Data

(60) Provisional application No. 61/148,926, filed on Jan. 31, 2009, provisional application No. 61/148,927, filed on Jan. 31, 2009.

(51) Int. Cl.
*H03K 19/173* (2006.01)
*G06F 1/04* (2006.01)

(52) U.S. Cl. ............. 326/38; 326/93; 713/501; 713/400

(58) Field of Classification Search .............. 326/37–41, 326/47
See application file for complete search history.

(56) References Cited

U.S. PATENT DOCUMENTS

| | | | |
|---|---|---|---|
| 7,007,188 B1 * | 2/2006 | Tischler et al. ............... | 713/501 |
| 7,102,391 B1 * | 9/2006 | Sun et al. ...................... | 327/10 |
| 2007/0040592 A1 * | 2/2007 | Ooki ............................ | 327/116 |

OTHER PUBLICATIONS

U.S. Appl. No. 12/689,558, filed Jan. 19, 2010, Shimanek et al., Xilinx, Inc., 2100 Logic Drive, San Jose, CA.
U.S. Appl. No. 12/689,585, filed Jan. 19, 2010, Shimanek, et al., Xilinx, Inc., 2100 Logic Drive, San Jose, CA.
U.S. Appl. No. 12/689,604, filed Jan. 19, 2010, Flateau, Jr., et al., Xilinx, Inc., 2100 Logic Drive, San Jose, CA.
U.S. Appl. No. 12/694,615, filed Jan. 27, 2010, Shimanek, et al., Xilinx, Inc., 2100 Logic Drive, San Jose, CA.
U.S. Appl. No. 12/694,665, filed Jan. 27, 2010, Wennekamp, et al., Xilinx, Inc., 2100 Logic Drive, San Jose, CA.
U.S. Appl. No. 12/689,636, filed Jan. 19, 2010, Wennekamp, et al., Xilinx, Inc., 2100 Logic Drive, San Jose, CA.
U.S. Appl. No. 12/693,397, filed Jan. 25, 2010, Wennekamp, et al., Xilinx, Inc., 2100 Logic Drive, San Jose, CA.
U.S. Appl. No. 12/692,771, filed Jan. 25, 2010, Flateau, Jr., et al., Xilinx, Inc., 2100 Logic Drive, San Jose, CA.
U.S. Appl. No. 12/696,672, filed Jan. 29, 2010, Shimanek, et al., Xilinx, Inc., 2100 Logic Drive, San Jose, CA.
U.S. Appl. No. 12/690,856, filed Jan. 20, 2010, Elkins, et al., Xilinx, Inc., 2100 Logic Drive, San Jose, CA.
U.S. Appl. No. 12/695,341, filed Jan. 28, 2010, Strader, et al., Xilinx, Inc., 2100 Logic Drive, San Jose, CA.
U.S. Appl. No. 12/695,099, filed Jan. 27, 2010, Shimanek, et al., Xilinx, Inc., 2100 Logic Drive, San Jose, CA.
U.S. Appl. No. 12/694,656 filed Jan. 27, 2010, Elkins, et al., Xilinx, Inc., 2100 Logic Drive, San Jose, CA.
MICRON, "DDR/DDR2 Controller Design", Nov. 2004, www.micron.com.

* cited by examiner

*Primary Examiner* — Shawki Ismail
*Assistant Examiner* — Jany Tran
(74) *Attorney, Agent, or Firm* — Murray Smith; Kevin T. Cuenot

(57) ABSTRACT

A technique is provided that involves: configuring a clock generation circuit to output a first signal having a first frequency that is one of a plurality of frequencies that are different; generating in a clock section of a further circuit as a function of the first signal a second signal having a second frequency that is one of the plurality of frequencies other than the first frequency; and configuring the clock section to supply to the further circuit a clock signal that is one of the first and second signals.

14 Claims, 5 Drawing Sheets

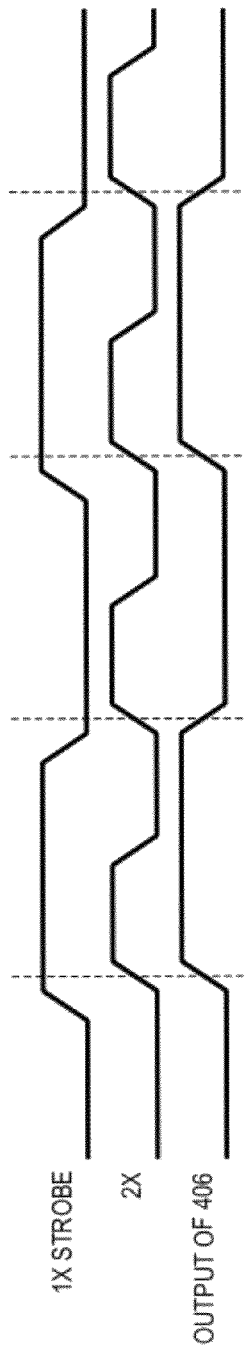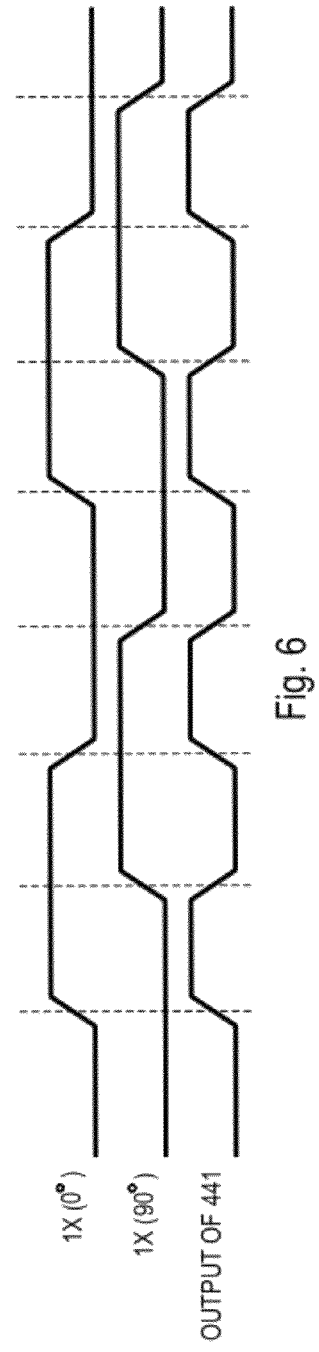

METHOD AND APPARATUS FOR DISTRIBUTING CLOCK SIGNALS

CROSS-REFERENCE TO RELATED APPLICATIONS

This application claims the priority under 35 U.S.C. §119 of U.S. Provisional Patent Application No. 61/148,926 filed on Jan. 31, 2009 and entitled "Apparatus and Method for a Memory Controller", and also U.S. Provisional Patent Application No. 61/148,927 filed on Jan. 31, 2009 and entitled "Architecture for Advanced Integrated Circuit Providing Good Performance and Low Cost". The disclosures of both of these provisional patent applications are hereby incorporated herein by reference in their entirety.

FIELD OF THE INVENTION

An embodiment of the invention relates to digital circuits. More particularly, an embodiment of the invention relates to techniques for distributing clock signals within a digital circuit.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Within an FPGA, different portions of the circuitry disposed at different locations may need clock signals with respective different frequencies. This presents issues as to how to distribute clock signals from a central clock generator to the various locations where different clocks are needed. On the one hand, it would be possible to distribute one or more clock signals having the highest frequency required anywhere. However, a higher frequency signal increases power consumption, and increases the potential for jitter and/or system noise. One cause of increased jitter is that fact that the shape of a high frequency signal may deviate farther from an ideal square wave than the shape of a lower frequency signal. An alternative approach is to distribute one or more clocks having a frequency lower than the highest required frequency, and then locally increase that frequency where a higher frequency is needed. However, variation in the duty cycle of one or more lower frequency clocks can potentially introduce jitter into higher frequency clocks that are generated from the lower frequency signals. Consequently, designing a system that distributes high frequency clocks can be advantageous for some applications but not other applications, whereas designing the system to distribute lower frequency clocks can also be advantageous for some applications but not other applications. Therefore, while existing clock distribution arrangements have been generally adequate for their intended purposes, they have not been satisfactory in all respects.

SUMMARY OF THE INVENTION

One embodiment of the invention involves an apparatus containing a circuit that includes: a clock generation circuit that outputs a first signal, and that includes a first frequency selection section that is configurable to cause the first signal to have a first frequency that is one of a plurality of frequencies that are different; and a further circuit having a clock section that is responsive to the first signal and generates as a function of the first signal a second signal having a second frequency that is one of the plurality of frequencies other than the first frequency, the further circuit including a second frequency selection section that is configurable to supply to the further circuit a clock signal that is one of the first and second signals.

Another embodiment of the invention involves an apparatus having a field-programmable device with circuitry that includes: a clock generation circuit that outputs a first signal, and that includes a first frequency selection section that is configurable during field programming to cause the first signal to have a first frequency that is one of a plurality of frequencies that are different; and a further circuit having a clock section that is responsive to the first signal and generates as a function of the first signal a second signal having a second frequency that is one of the plurality of frequencies other than the first frequency, the further circuit including a second frequency selection section that is configurable during field programming to supply to the further circuit a clock signal that is one of the first and second signals.

Yet another embodiment of the invention involves a method that includes: configuring a clock generation circuit to output a first signal having a first frequency that is one of a plurality of frequencies that are different; generating in a clock section of a further circuit as a function of the first signal a second signal having a second frequency that is one of the plurality of frequencies other than the first frequency; and configuring the clock section to supply to the further circuit a clock signal that is one of the first and second signals.

BRIEF DESCRIPTION OF THE DRAWINGS

FIGS. 5 and 6 are timing diagrams showing selected signals within respective different portions of the circuitry depicted in FIG. 4.

DETAILED DESCRIPTION

Figure 1:
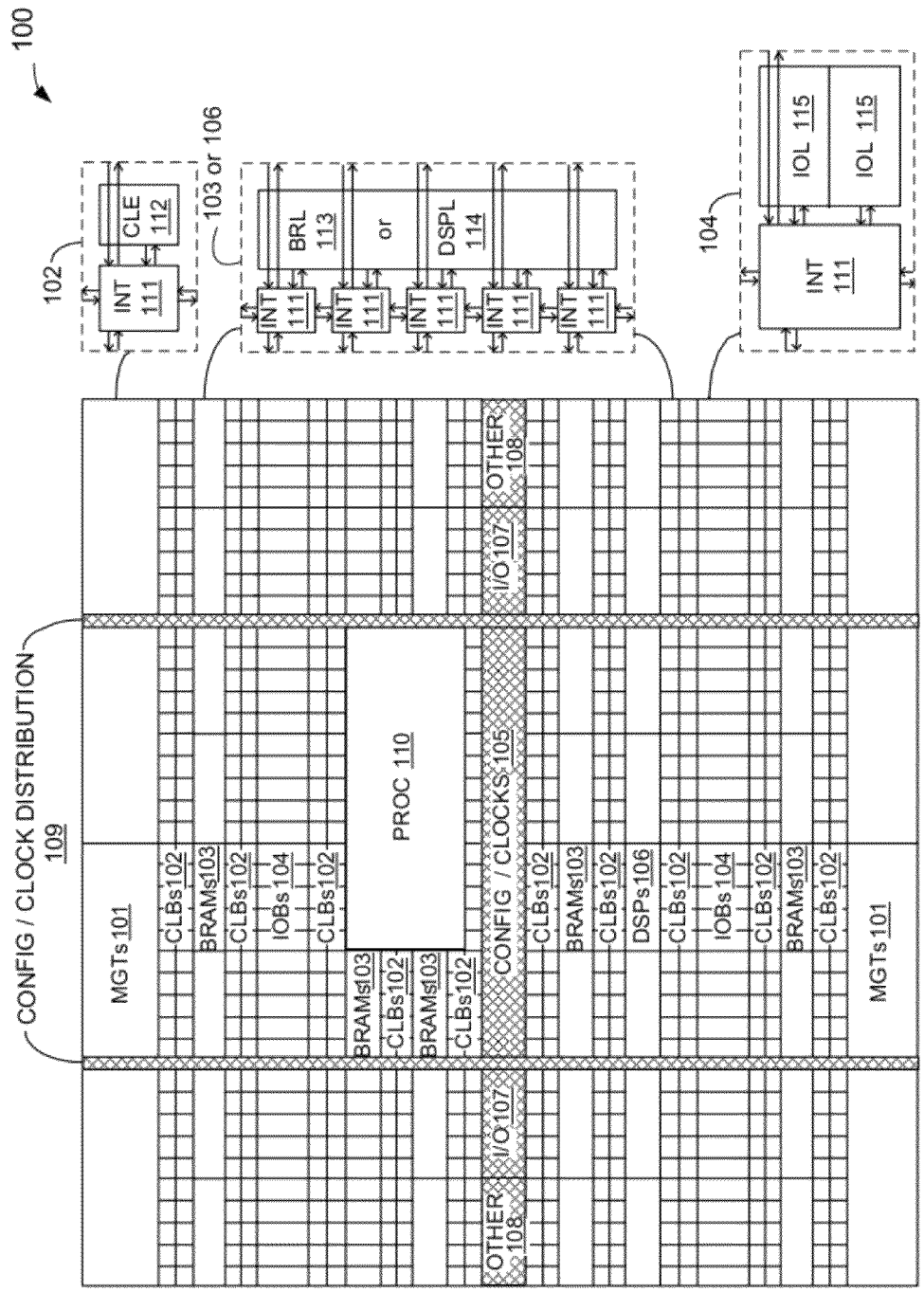
FIG. 1 is a diagrammatic view of an advanced field programmable gate array (FPGA) architecture that includes several different types of programmable logic blocks.

FIG. 1 is a diagrammatic view of an advanced field programmable gate array (FPGA) architecture 100 that includes several different types of programmable logic blocks. For example, the FPGA architecture 100 in FIG. 1 has a large number of different programmable tiles, including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g. configuration ports and clock ports), and other programmable logic 108 such as digital clock managers, analog-to-digital converters, system monitoring logic, and so forth. The FPGA 100 also includes dedicated processor blocks (PROC) 110.

In the FPGA 100, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The programmable interconnect element (INT) 111 also includes the connections to and from the programmable logic element within the same tile, as shown by the examples included at the top of FIG. 1.

For example, a CLB 102 can include a configurable logic element (CLE) 112 that can be programmed to implement user logic plus a single programmable interconnect element (INT) 111. A BRAM 103 can include a BRAM logic element (BRL) 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of programmable interconnect elements. An IOB 104 can include, for example, two instances of an input/output logic element (IOL) 115 in addition to one instance of the programmable interconnect element (INT) 111. As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. In other embodiments, the configuration logic may be located in different areas of the FPGA die, such as in the corners of the die.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

FIG. 1 illustrates one exemplary FPGA architecture. For example, the numbers of logic blocks in a column, the relative width of the columns, the number and order of columns, the types of logic blocks included in the columns, the relative sizes of the logic blocks, the locations of the logic blocks within the array, and the interconnect/logic implementations included at the top of FIG. 1 are purely exemplary. In an actual FPGA, more than one adjacent column of CLBs is typically included wherever the CLBs appear, to facilitate the efficient implementation of user logic, but the number of adjacent CLB columns varies with the overall size of the FPGA.

Figure 2:
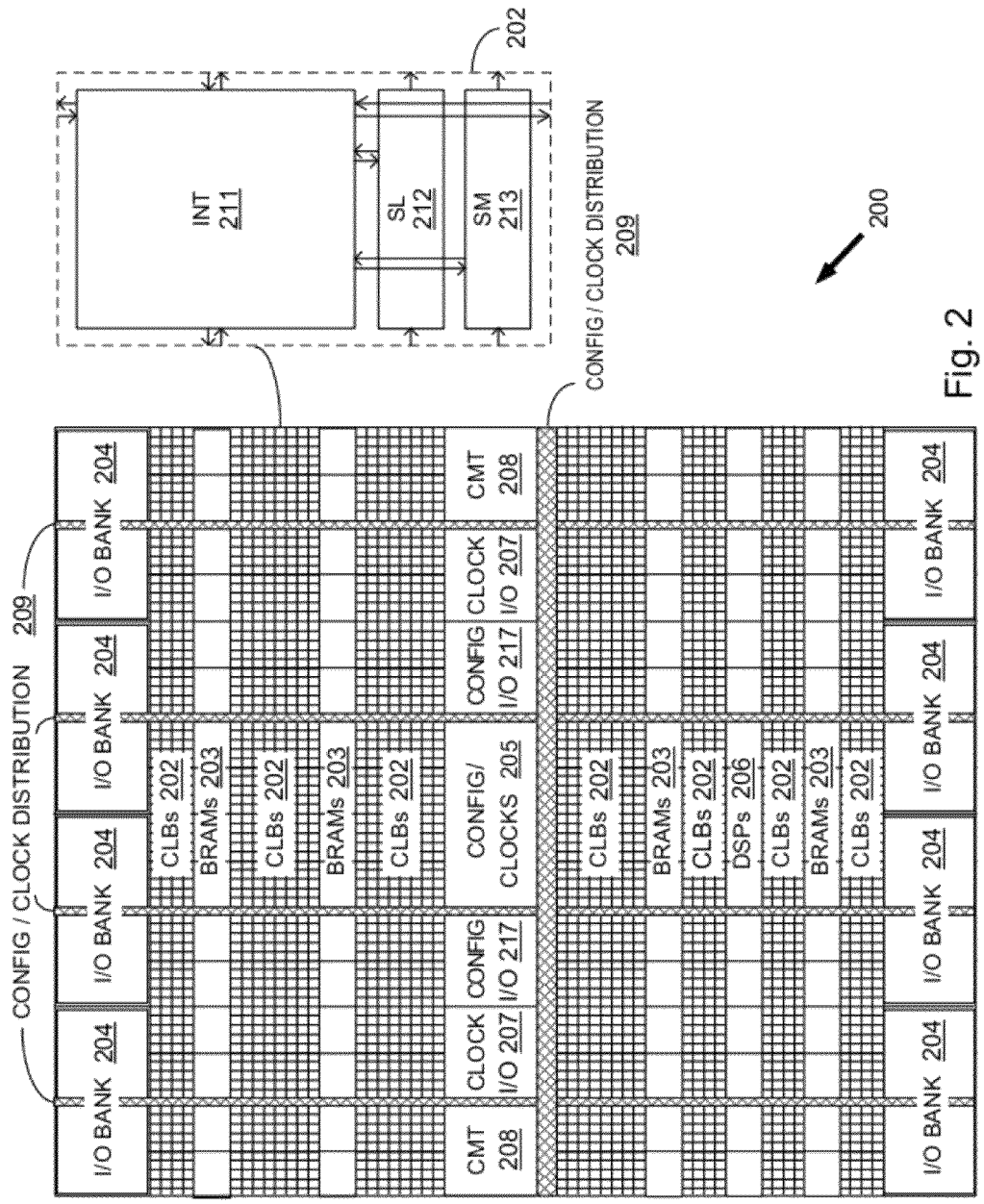
FIG. 2 is a diagrammatic view of another FPGA architecture that is an alternative embodiment of and uses the same general architecture as the FPGA of FIG. 1, and that includes several different types of programmable logic blocks.

FIG. 2 is a diagrammatic view of another FPGA architecture 200 that is an alternative embodiment of and uses the same general architecture as the FPGA of FIG. 1, and that includes several different types of programmable logic blocks. The FPGA 200 of FIG. 2 includes CLBs 202, BRAMs 203, I/O blocks divided into "I/O Banks" 204 (each including 40 I/O pads and the accompanying logic), configuration and clocking logic 205, DSP blocks 206, clock I/O 207, clock management circuitry (CMT) 208, configuration I/O 217, and configuration and clock distribution areas 209.

In the FPGA 200 of FIG. 2, an exemplary CLB 202 includes a single programmable interconnect element (INT) 211 and two different "slices", slice L (SL) 212 and slice M (SM) 213. In some embodiments, the two slices are the same (e.g. two copies of slice L, or two copies of slice M). In other embodiments, the two slices have different capabilities. In some embodiments, some CLBs include two different slices and some CLBs include two similar slices. For example, in some embodiments some CLB columns include only CLBs with two different slices, while other CLB columns include only CLBs with two similar slices.

Figure 3:
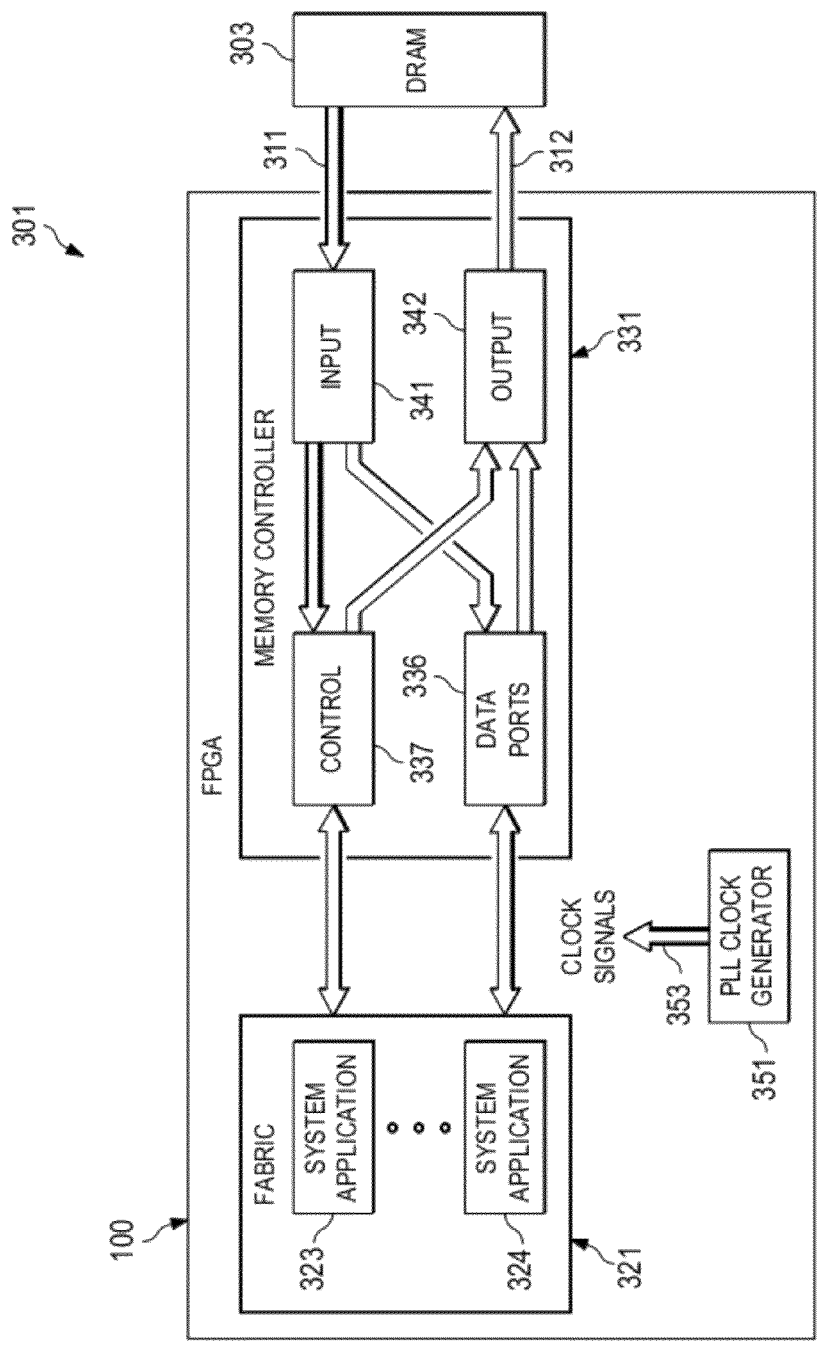
FIG. 3 is a high-level block diagram showing a circuit that includes the FPGA of FIG. 1, and a dynamic random access memory (DRAM) that is external to the FPGA.

FIG. 3 is a high-level block diagram showing an apparatus 301 that is a circuit including the FPGA 100 (FIG. 1), and a dynamic random access memory (DRAM) 303 external to the FPGA. The FPGA 100 in FIG. 3 could alternatively be the FPGA 200 of FIG. 2. FIG. 3 does not show everything in the FPGA 100. FIG. 3 shows only portions of the circuitry within FPGA 100 that facilitate an understanding of the disclosed embodiment of the invention.

The memory 303 is a standard double data rate (DDR) device with a standard memory interface. Alternatively, however, the memory 303 could be a memory of a different double data rate type (for example DDR2, DDR3, LPDDR, or mobile DDR). As yet another alternative, the memory 303 could be any of a variety of other types of memory devices, including devices that are not of the double data rate type. The interface between the memory 303 and the FPGA 100 includes a number of signals 311 that go from the memory to the FPGA, and a number of signals 312 that go from the FPGA to the memory.

The FPGA 100 includes a fabric 321 of a known type, which is programmed or configured during field configuration of the FPGA 100. The programming or configuration of the fabric 321 typically results in the creation of one or more system applications or circuits within the fabric, two of which are shown diagrammatically at 323 and 324 in FIG. 3.

The FPGA 100 includes a memory controller circuit 331 that handles transfers of data between the fabric 321 and the external memory 303. The memory controller circuit 331 has one or more data ports 336 that each provide temporary storage (data buffering) for data traveling from the fabric 321 to the memory 303, and for data travelling from the memory to the fabric. The memory controller circuit 331 also has control circuitry 337 that controls the transfer of data in either direction between the fabric 321 and the memory 303. The control circuitry 337 receives control signals from the fabric 321, including commands that specify whether the memory controller circuit 331 should read data from or write data to the memory 303, and that includes memory addresses specifying the memory locations that are to be read or written. In turn, the control circuitry 337 sends control signals to and receives control signals from the memory 303.

The memory controller circuit 331 and the memory 303 run on different clock signals that are asynchronous. The memory controller circuit 331 includes input circuitry 341 that receives from memory 303 the signals 311 that are synchronized to the clock signal of the memory. The input circuitry captures these incoming signals 311, and transitions them to synchronization with a clock signal of the memory controller circuit. As noted earlier, some of the incoming signals 311 are data, and in the disclosed embodiment the data arriving at 311 from memory 303 is DDR data. In other words, a first data word (for example 4 bits) is received on the leading edge of the memory clock signal, and a second data word (for example 4 bits) is received on the falling edge of the memory clock signal. The input circuitry 341 combines these two successive words into a single word (for example 8 bits), which is then passed on to one of the data ports 336.

The memory controller circuit 331 has output circuitry 342, which includes drivers for output signals leaving the FPGA 100 at 312. As explained earlier, some of the output signals 312 are data. In the disclosed embodiment, the output circuitry 342 accepts data words from the data ports 336, and converts these words to DDR data. For example, the output circuitry 342 accepts a data word (for example 8 bits) from one of the data ports 336, split it into two words (for example 4 bits each), and then transmits those two words successively at 312 to the memory 303.

Due to the fact that the output circuitry 342 is converting data words from the data ports 336 into DDR data, the rate of which data words leave the output circuitry 342 in effectively twice the rate at which data words arrive at the output circuitry. As a result, in order to ensure accurate handling of data within the output circuitry 342, it is desirable for the output circuitry 342 to use a clock signal having a frequency that is twice the frequency of clock signals used in other portions of the memory controller circuit, such as the data ports 336, the control circuitry 337, and the input circuitry 341. The FPGA 100 includes phase-locked loop (PLL) clock generator circuitry 351 that produces one or more clock signals 353 to be distributed within the FPGA, including clock signals for the memory controller circuit 331 and the fabric 321.

Figure 4:
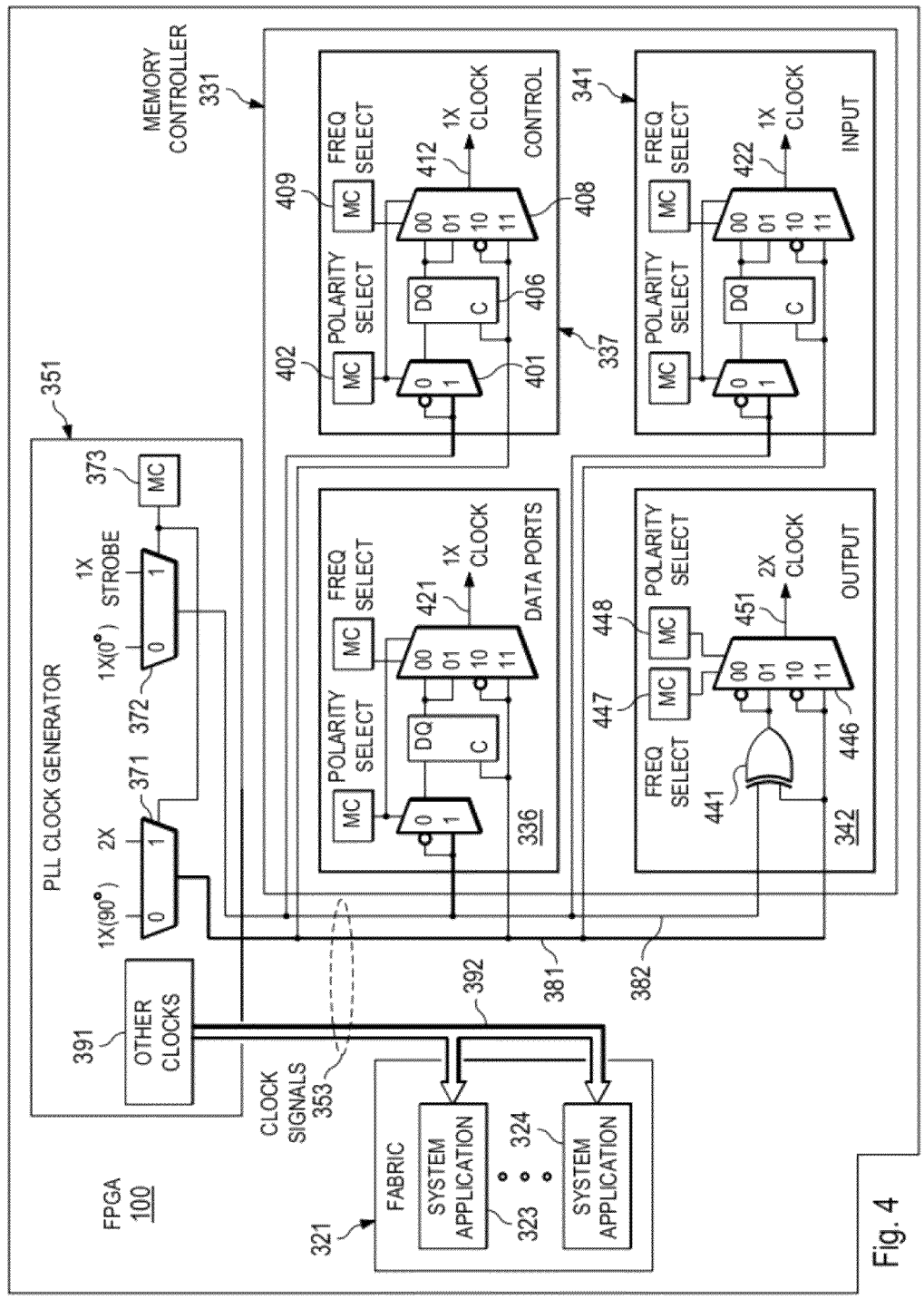
FIG. 4 is a high-level block diagram showing in greater detail selected portions of the FPGA of FIGS. 1 and 3.

FIG. 4 is a high-level block diagram depicting selected portions of the FPGA 100 in greater detail, including the PLL clock generator circuitry 351, the fabric 321 with system applications 323 and 324, and the memory controller circuit 331 with the data ports 336, the control circuitry 337, the input circuitry 341, and the output circuitry 342. The PLL clock generator circuitry 351 can, in a known manner, generate PLL-based clock signals having two different frequencies, where one frequency is twice the other. For purposes of this discussion, it is assumed that the clock generator circuitry 351 generates one or more clock signals having a frequency of 400 MHz (referred to herein as 1× clock signals), and/or one or more clock signals having a frequency of 800 MHz (referred to herein as 2× clock signals).

In FIG. 4, the clock generator circuitry 351 includes a pair of two-to-one selectors 371 and 372, each of which has two inputs and one output. The two selectors 371-372 each have a single control input that is controlled by the output of a single memory cell 373. During field programming of the FPGA 100, the state of the memory cell is set to either a binary "0" or a binary "1". If the memory cell 373 is set to a binary "0", then the two selectors 371 and 372 each select the "0" input (the left input as viewed in FIG. 4). Alternatively, if the memory cell 373 is set to a binary "1", then the two selectors 371-372 each select the "1" input (the right input as viewed in FIG. 4).

The clock generator circuitry 351 generates a 400 MHz clock signal 1×(0°), and another 400 MHz clock signal 1×(90°) that is identical to and synchronized with the clock signal 1×(0°), except that there is a phase difference of 90° between these two clock signals. The clock signal 1×(90°) is supplied to the left or "0" input of the selector 371, and the clock signal 1×(0°) is supplied to the left or "0" input of the selector 372. The clock generator circuitry 351 also generates an 800 MHz clock signal 2× that is supplied to the right or "1" input of the selector 371. Further, the clock generator circuitry 351 generates a 400 MHz strobe signal 1× STROBE that is supplied to the right or "1" input of the selector 372, and that is synchronized to the 2× clock signal.

The outputs of the selectors 371 and 372 drive respective clock distribution lines 381 and 382 that extend throughout the memory controller circuit 331, and possibly to other not-illustrated portions of the FPGA 100. If the memory cell 373 is set to a binary "0" during field programming, then the 400 MHz clock signal 1×(90°) is selected and supplied to the clock distribution line 381 by the selector 371, and the 400 MHz clock signal 1×(0°) is selected and supplied to the clock distribution line 382 by the selector 372. Thus, in this configuration, the clock generator circuitry 351 is distributing 1× clocks on the lines 381 and 382. Alternatively, if the memory cell 373 is set to a binary "1" during field configuration, then the clock signal 2× is selected and supplied to the clock distribution line 381 by the selector 371, and the strobe signal 1× STROBE is selected and supplied to the clock distribution line 382 by the selector 372. In this configuration, the clock generator circuitry 351 is distributing the 2× clock signal on line 381, supplemented by the 1× strobe signal on line 382.

For purposes of this disclosure, it is assumed that the clock generator circuitry 351 generates all of the clock signals 1×(0°), 1×(90°), and 2×, as well as the strobe signal 1× STROBE, and that the selectors 371 and 372 are provided to select from among these signals. Alternatively, however, it would be possible for the clock generator circuitry 351 to be configured so that the selectors 371 and 372 are omitted and, in response to the state of memory cell 373, the clock generator circuitry generates either the signals 1×(0°) and 1×(90°) but not the signals 2× and 1× STROBE, or generates the signals 2× and 1× STROBE but not the signals 1×(0°) and 1×(90°).

In the disclosed embodiment, the clock generator circuitry 351 includes additional circuitry 391 to generate other clock signals 392 that are supplied to the system applications 323-324 within the fabric 321. Alternatively, however, one or more of the system applications 323-324 could instead receive and use one or both of the signals on the clock distribution lines 381 and 382.

Within the memory controller circuit 331, the clock distribution lines 381 and 382 are each routed to the control circuitry 337, the data ports 336, the input circuitry 341, and the output circuitry 342. The control circuitry 337 includes a 2-input two-to-one selector 401, and a memory cell 402 with an output coupled to the control input of the selector 401. The state of the memory cell 402 is set during field programming of the FPGA 100. When the memory cell 402 contains a binary "0", the selector 401 routes its "0" input to its output, the "0" input being an inverting input. When the memory cell 402 contains a binary "1", the selector 401 routes its non-inverting "1" input to its output. The clock distribution line 382 is coupled to both inputs of the selector 401. The memory cell 402 and the selector 401 thus serve to select one of two polarities of the signal on clock distribution line 382.

The control circuitry 337 includes a D-type flip-flop 406 having its data input coupled to the output of the selector 401, and having its clock input coupled to the clock distribution line 381. The control circuitry 337 includes a 4-input four-to-one selector 408, and a further memory cell 409. The state of the memory cell 409 is set during field programming of the FPGA 100. The outputs of the memory cells 402 and 409 are coupled to respective control inputs of the selector 408. As discussed in more detail below, the memory cell 409 performs a frequency selection function at the selector 408, and the memory cell 402 performs a polarity selection function at the selector 408. The "00" and "01" inputs of the selector 408 are non-inverting inputs that are both coupled to the output of the flip-flop 406. The inverting "10" input and the non-inverting "11" input of the selector 408 are both coupled to the clock distribution line 381. The output 412 of the selector 408 carries a clock signal to be distributed locally for use within the control circuitry 337. During field programming of the FPGA 100, the memory cell 409 is set to a binary value that ensures the clock signal at the output 412 of the selector 408 always has a 1× frequency. In this regard, there are two possible scenarios that are discussed separately below.

First, assume that the memory cell 373 in the clock generator circuitry 351 is set to a binary "0" during field programming, so that the clock distribution lines 381 and 382 are respectively carrying the two 1× clock signals 1×(90°) and 1×(0°). In this situation, the memory cell 409 will be set to a binary "1", and the memory cell 402 will be set to either a binary "0" or binary "1", in dependence on the desired polarity for the clock signal that will appear at the output 412 of the selector 408. Consequently, either the "10" input or the "11" input of the selector 408 will be routed to the selector output 412. When the "11" input is selected, the clock signal 1×(90°) is routed without change through the selector 408 to the output 412. When the "10" input is selected, the clock signal 1×(90°) is inverted, and then routed through the selector 408 to the output 412. In either case, the clock signal at the output 412 of the selector 408 has a 1× frequency.

Alternatively, assume that memory cell 373 in the clock generator circuitry 351 is set to a binary "1" during field programming, so that the clock distribution lines 381 and 382 are respectively carrying the clock signal 2× and the strobe signal 1× STROBE. In this situation, the memory cell 409 will be set during field programming to a binary "0", and the memory cell 402 will be set to either a binary "0" or "1", in dependence on the desired polarity for the clock signal that will appear at the output of the selector 408. Depending on the state of the memory cell 402, the selector 401 will either route the signal 1× STROBE without change to its output, or will invert the signal 1× STROBE and then route the inverted signal to its output. Thus, polarity selection occurs within the selector 401. This output signal from the selector 401 is supplied to the data input of the flip-flop 406. The clock signal 2× is supplied to the clock input of the flip-flop 406. FIG. 5 is a timing diagram showing the 1× STROBE signal at the data input of the flip-flop 406, the 2× clock signal at the clock input of the flip-flop, and the resulting signal at the output of the flip-flop 406.

The memory cells 402 and 409 will be selecting either the "00" input or the "01" input of the selector 408, but in either case the 1× clock signal from the output of the flip-flop 406 will be routed without change through the selector 408 to its output 412. Thus, even though the clock generator circuitry 351 is distributing the clock signal 2× on the clock distribution line 381, this 2× signal is converted locally to a 1× clock signal within the control circuitry 337. Consequently, regardless of whether the clock generator circuitry 351 is distributing 1× clock signals or a 2× clock signal, the clock signal at the output 412 of the selector 408 will always have a 1× frequency.

The data ports 336 and the input circuitry 341 each include clock handling circuitry that is identical to the clock handling circuitry just described in association with the control circuitry 337. Therefore, to avoid redundancy, the clock handling circuitry within each of the data ports 336 and within the input circuitry 341 is not described again here in detail. Instead, it is sufficient to note that the data ports 336 each have a selector output 421 that will always carry a 1× clock signal, and the input circuitry 341 has a selector output 422 that will always carry a 1× clock signal.

The output circuitry 342 includes an exclusive OR (XOR) gate 441 with two inputs that are each coupled to a respective one of the clock distribution lines 381 and 382. The output circuitry 342 also includes a 4-input four-to-one selector 446 having an inverting "00" input coupled to the output of gate 441, a non-inverting "01" input coupled to the output of gate 441, an inverting "10" input coupled to the clock distribution line 381, and a non-inverting "11" input coupled to the clock distribution line 381. Two memory cells 447 and 448 each have an output coupled to a respective control input of the selector 446. The memory cell 447 serves a frequency selection function, and the memory cell 448 serves a polarity selection function. The memory cells 447 and 448 are each set during field programming of the FPGA 100, in a manner so that the output 451 of the selector 446 always carries a clock signal with a 2× frequency. In this regard, there are two possible scenarios that are discussed separately below.

First, assume that during field programming the memory cell 373 in the clock generator circuitry 351 is set to a binary "0". As a result, the selectors 371 and 372 will be supplying the 1× clock signals 1×(90°) and 1×(0°) to the clock distribution lines 381 and 382, respectively. The two inputs of the XOR gate 441 will respectively be receiving these two clock signals 1×(90°) and 1×(0°). FIG. 6 is timing diagram showing the two signals 1×(90°) and 1×(0°) that are supplied to the respective inputs of the XOR gate 441, and showing the resulting signal at the output of the gate 441. Although each input of the gate 441 receives a clock signal having a 1× frequency, the resulting signal at the output of gate 441 has 2× frequency. During field programming, the memory cells 447 and 448 are set to select either the "00" input or the "01" input of the selector 446. If the "01" input is selected, the 2× signal at the output of gate 441 is selected and then supplied without change to the output 451 of the selector 446. Alternatively, if the "00" input is selected, the 2× signal at the output of gate 441 is inverted, and then supplied to the output 451 of the selector 446. In either case, the signal at the output 451 of the selector 446 has a 2× frequency.

Alternatively, assume that the memory cell 373 is set during field programming to a binary "1". In this case, the selectors 371 and 372 respectively supply the clock signal 2× and the strobe signal 1× STROBE to the clock distribution lines 381 and 382. The memory cells 447 and 448 are set during field programming to select either the "10" input or the "11" input of the selector 446. If the "11" input is selected, the clock signal 2× from the clock distribution line 381 is selected and then supplied without change to the selector output 451. On the other hand, if the "10" input is selected, then the clock signal 2× from the clock distribution line 381 is inverted, and then supplied to the output 451 of the selector. In either case, the signal at the output 451 of the selector 446 has a 2× frequency. In this manner, regardless of the state of the memory cell 373 and the frequencies of the signals on the distribution lines 381 and 382, the output 451 of the selector 446 will always carry a clock signal with a 2× frequency.

When the memory cell 373 is set to a binary "0", so that the selectors 371 and 372 distribute the 1× clock signals 1×(90°) and 1×(0°), there is lower power consumption within the FPGA 100 than when the memory cell 373 is set to a binary "1" to distribute at 381 the clock signal with a 2× frequency. On the other hand, as evident from FIG. 6, when the 1× clock signals 1×(90°) and 1×(0°) are distributed, successive rising edges of the 2× signal produced by XOR gate 441 are alternately caused by rising and falling edges of a single 1× clock signal. Consequently, any variation in the duty cycle of that 1× signal will cause jitter in the resulting 2× signal. However, due to the fact that the two 1× clock signals 1×(90°) and 1×(0°) are both generated internally to the FPGA 100 by the same clock generator circuitry 351, jitter in the 2× clock signal generated by the gate 441 should be nominal.

If the memory cell 373 is set to cause the selectors 371 and 372 to distribute the clock signal 2×, with its strobe signal 1× STROBE, the 2× clock signal utilized within the output circuitry 342 will have minimal jitter, because it is generated directly by a PLL in the clock generator circuitry 351. However, this must be balanced against the fact that, as noted above, there will be a higher level of power consumption within the FPGA 100 as a result of the distribution of the higher frequency 2× signal. Also, if the FPGA 100 is configured so that the clock distribution line 381 is single-ended rather than a differential pair, a 2× clock distributed on line 381 could potentially experience jitter or generate system noise. On the other hand, even in the case of a single-ended line, any such jitter or noise should be nominal in view of the fact that the distribution line 381 is entirely internal to the FPGA.

FIG. 4 shows, at each of several different locations, the local generation and/or selection of only a single clock signal, which in particular are the 1× clock signal at 412 in the control circuitry 337, the 1× clock signal at 421 in the data ports 336, the 1× clock signal at 422 in the input circuitry 341, and the 2× clock signal at 451 in the output circuitry 342. Alternatively, however, If any of these circuits have local need for a further clock signal with a different frequency and/or a different phase, persons skilled in the art will readily recognize how to achieve this utilizing the teachings above, including the capability to programmably select during field programming the frequency and/or polarity of that additional signal.

Although a selected embodiment has been illustrated and described in detail, it should be understood that substitutions and alterations are possible without departing from the spirit and scope of the present invention, as defined by the claims that follow.

What is claimed is:

1. An apparatus comprising circuitry that includes:
   a clock generation circuit that outputs a first signal, and that includes a first frequency selection section that is configurable to cause the first signal to have a first frequency that is one of a plurality of frequencies that are different; and
   a further circuit having a clock section that is responsive to the first signal and generates as a function of the first signal a second signal having a second frequency that is one of the plurality of frequencies other than the first frequency, the further circuit including a second frequency selection section that is configurable to supply to the further circuit a clock signal that is one of the first and second signals;
   wherein the clock generation circuit outputs a third signal and the first frequency selection section causes:
   (a) the third signal to have the first frequency and to have a phase shift with respect to the first signal; or
   (b) the third signal to have the second frequency, the second frequency is less than the first frequency, and the clock section includes a D-type flip-flop having a clock input coupled to the first signal, a further input coupled to the third signal, and an output that carries the second signal.

2. An apparatus according to claim 1,
   wherein the clock section includes an exclusive OR gate having two inputs that respectively receive the first and third signals, the output of the exclusive OR gate being the second signal.

3. An apparatus according to claim 2,
   including a field-programmable device that includes the circuitry, the first and second frequency selection sections each being configured during field programming; and
   wherein the second frequency selection section includes a memory cell that is set during field programming, and a selector having a control input responsive to the output of the memory cell, having two inputs respectively responsive to the first and second signals, and having an output that carries the clock signal.

4. An apparatus according to claim 1,
   including a field-programmable device that includes the circuitry, the first and second frequency selection sections each being configured during field programming; and
   wherein the second frequency selection section includes a memory cell that is set during field programming, and a signal selector having a control input responsive to the output of the memory cell, having two inputs respectively responsive to the first and second signals, and having an output that carries the clock signal.

5. An apparatus according to claim 4,
   wherein the second frequency selection section includes a further memory cell that is set during field programming, and a further selector having a control input responsive to the output of the further memory cell, having inverting and non-inverting inputs both coupled to the third signal, and having an output coupled to the further input of the flip-flop; and wherein the signal selector has a further control input responsive to the output of the further memory cell, and having two further inputs that are inverting inputs and that are respectively coupled to the first and second signals.

6. The apparatus according to claim 1, wherein the second frequency selection section comprises:
   a memory cell that is set during field programming; and
   a selector having a control input responsive to an output of the memory cell;
   wherein the selector includes two inputs responsive to the first and second signals, and having an output that carries the clock signal.

7. The apparatus according to claim 1, wherein the first frequency selection section comprises:
   a memory cell that is set during field programming; and
   a selector having a control input responsive to an output of the memory cell;
   wherein the selector is configured during field programming to select the first signal from a plurality of signals having frequencies corresponding to the plurality of frequencies that are different.

8. The apparatus according to claim 1, wherein the first frequency selection section is configured to select a signal from a plurality of signals and pass the selected signal; and
   wherein the second frequency selection section is configurable to select either the first signal or the second signal and pass the selected signal as the clock signal.

9. An apparatus comprising a programmable device having circuitry that includes:
   a clock generation circuit that outputs a first signal, and that includes a first frequency selection section that is configurable during field programming to cause the first signal to have a first frequency that is one of a plurality of frequencies that are different; and
   a further circuit having a clock section that is responsive to the first signal and generates as a function of the first signal a second signal having a second frequency that is one of the plurality of frequencies other than the first frequency, the further circuit including a second frequency selection section that is configurable during field programming to supply to the further circuit a clock signal that is one of the first and second signals;
   wherein the clock generation circuit outputs a third signal and the first frequency selection section causes:
   (a) the third signal to have the first frequency and to have a phase shift with respect to the first signal; or
   (b) the clock generation circuit outputs a third signal and the first frequency selection section causes the third signal to have the second frequency.

10. An apparatus according to claim 9,
   wherein the clock section includes an exclusive OR gate having two inputs that respectively receive the first and third signals, the output of the exclusive OR gate being the second signal; and
   wherein the second frequency selection section includes a memory cell that is set during field programming, and a selector having a control input responsive to the output of the memory cell, having two inputs respectively responsive to the first and second signals, and having an output that carries the clock signal.

11. An apparatus according to claim 9,
   wherein the second frequency is less than the first frequency;
   wherein the second frequency selection section includes a first memory cell that is set during field programming, and a first selector having a control input responsive to the output of the first memory cell, having inverting and non-inverting inputs both coupled to the third signal, and having an output;
   wherein the clock section includes a D-type flip-flop having a clock input coupled to the first signal, a further input coupled to the output of the first selector, and an output that carries the second signal; and
   wherein the second frequency selection section includes a second memory cell that is set during field programming, and a second selector having two control inputs respectively responsive to the outputs of the first and second memory cells, having two non-inverting inputs each responsive to the second signal, having inverting and non-inverting inputs each responsive to the first signal, and having an output that carries the clock signal.

12. A method comprising:
   configuring a clock generation circuit to select a first signal from a plurality of signals and pass the first signal having a first frequency that is one of a plurality of frequencies that are different;
   generating in a clock section of a further circuit as a function of the first signal a second signal having a second frequency that is one of the plurality of frequencies other than the first frequency; and
   configuring the clock section to select and pass to the further circuit a clock signal that is one of the first and second signals;
   wherein the clock generation circuit outputs a third signal and the configuring of the clock generation circuit is carried out in a manner causing:
   (a) the third signal to have the first frequency and to have a phase shift with respect to the first signal, and wherein the configuring includes performing an exclusive or of the first and third signals to obtain the second signal; or
   (b) the third signal to have the second frequency and the second frequency to be less than the first frequency and wherein the generating includes supplying the first signal to a clock input of a D-type flip-flop, coupling a further input of the flip-flop to the third signal, and using an output of the flip-flop as the second signal.

13. A method according to claim 12,
   wherein the clock generation circuit and the clock section are each field programmable;
   wherein the configuring of the clock generation circuit is carried out during field programming; and
   wherein the configuring of the clock section is carried out during field programming.

14. A method according to claim 12, wherein the generating is carried out so that one of the first and second frequencies is twice the other thereof.

* * * * *